(12) United States Patent
Ochi et al.

(10) Patent No.: US 9,927,993 B2
(45) Date of Patent: Mar. 27, 2018

(54) SEMICONDUCTOR MEMORY DEVICE

(71) Applicant: TOSHIBA MEMORY CORPORATION, Tokyo (JP)

(72) Inventors: Yusuke Ochi, Yokohama Kanagawa (JP); Masanobu Shirakawa, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/286,751

(22) Filed: Oct. 6, 2016

(65) Prior Publication Data

US 2017/0262199 A1  Sep. 14, 2017

(30) Foreign Application Priority Data

Mar. 14, 2016 (JP) .................. 2016-049718

(51) Int. Cl.
*G11C 16/04* (2006.01)
*G06F 3/06* (2006.01)
*G11C 16/10* (2006.01)
*G11C 16/34* (2006.01)
*G11C 16/16* (2006.01)
*G06F 12/06* (2006.01)

(52) U.S. Cl.
CPC ............ *G06F 3/0619* (2013.01); *G06F 3/065* (2013.01); *G06F 3/0659* (2013.01); *G06F 3/0685* (2013.01); *G06F 12/0638* (2013.01); *G11C 16/0483* (2013.01); *G11C 16/10* (2013.01); *G11C 16/16* (2013.01); *G11C 16/3459* (2013.01); *G06F 2212/205* (2013.01)

(58) Field of Classification Search
CPC ..... G11C 16/16; G11C 16/3459; G11C 16/10; G11C 16/0483
See application file for complete search history.

(56) References Cited

U.S. PATENT DOCUMENTS

| | | | |
|---|---|---|---|
| 6,778,443 B2 | 8/2004 | Shiga et al. | |
| 6,903,980 B2 | 6/2005 | Miki et al. | |
| 7,852,675 B2 | 12/2010 | Maejima | |
| 8,233,323 B2 | 7/2012 | Hishida et al. | |
| 8,372,720 B2 | 2/2013 | Fukuzumi et al. | |
| 8,514,627 B2 | 8/2013 | Itagaki et al. | |
| 8,913,431 B1 * | 12/2014 | Costa ................ | G11C 16/0408 365/185.05 |
| 8,952,426 B2 | 2/2015 | Maejima | |
| 9,036,411 B2 | 5/2015 | Itagaki | |

(Continued)

FOREIGN PATENT DOCUMENTS

JP  2614357 B2  5/1997
JP  2003257190 A  9/2003

(Continued)

*Primary Examiner* — Khamdan Alrobaie
(74) *Attorney, Agent, or Firm* — Patterson & Sheridan, LLP

(57) ABSTRACT

A semiconductor memory device includes a memory cell array including a block of memory cells, gates of which are connected to a plurality of word lines, and a control unit configured to perform a writing operation in response to a command received from the outside, the writing operation including applying a program level voltage to at least two word lines at the same time.

10 Claims, 17 Drawing Sheets

(56) References Cited

U.S. PATENT DOCUMENTS

| | | | |
|---|---|---|---|
| 2005/0270842 A1* | 12/2005 | Furuta | G11C 11/5628 |
| | | | 365/185.09 |
| 2011/0284946 A1 | 11/2011 | Kiyotoshi | |
| 2013/0007353 A1* | 1/2013 | Shim | G11C 16/10 |
| | | | 711/103 |
| 2015/0113342 A1* | 4/2015 | Jung | G11C 8/14 |
| | | | 714/721 |
| 2015/0262674 A1 | 9/2015 | Shirakawa | |
| 2015/0293809 A1* | 10/2015 | Liang | G06F 11/073 |
| | | | 714/704 |
| 2016/0342458 A1* | 11/2016 | Cai | G11C 29/44 |
| 2017/0110183 A1* | 4/2017 | Chung | G06F 3/0619 |

FOREIGN PATENT DOCUMENTS

| | | |
|---|---|---|
| JP | 2004014086 A | 1/2004 |
| JP | 2015176623 A | 10/2015 |

* cited by examiner

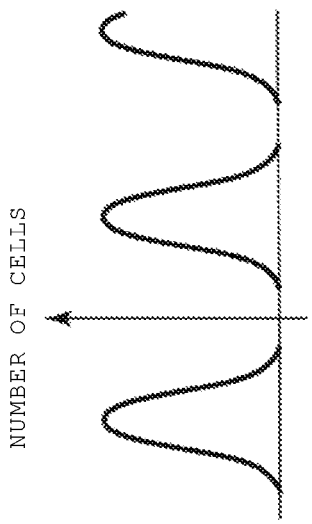
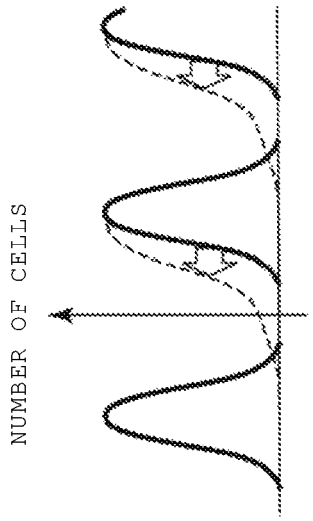
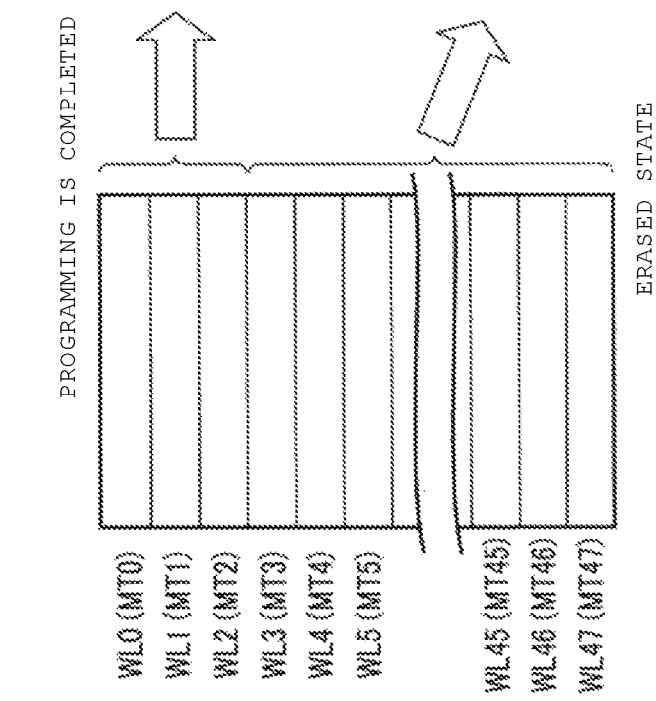

SEMICONDUCTOR MEMORY DEVICE

CROSS-REFERENCE TO RELATED APPLICATION

This application is based upon and claims the benefit of priority from Japanese Patent Application No. 2016-049718, filed Mar. 14, 2016, the entire contents of which are incorporated herein by reference.

FIELD

Embodiments described herein relate generally to a semiconductor memory device.

BACKGROUND

A NAND flash memory having memory cells arranged in three dimensions is known.

DESCRIPTION OF THE DRAWINGS

FIG. 6A is a schematic diagram of the memory cell transistor; FIG. 6B is a graph illustrating the threshold distribution of the memory cell transistor for which programming is completed; and FIG. 6C is a graph illustrating a threshold voltage distribution of an unused ("not-in-use") memory cell transistor.

DETAILED DESCRIPTION

Figure 1:
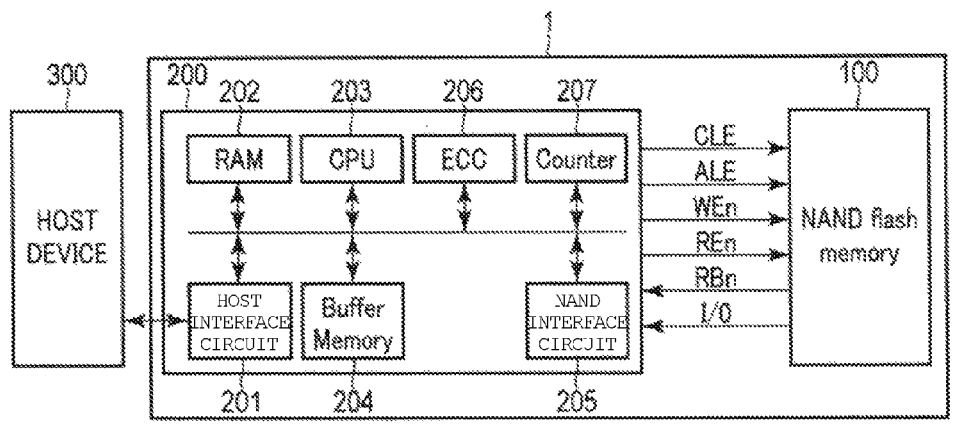
FIG. 1 is a diagram illustrating a configuration of a memory system including a semiconductor memory device.

In general, according to one embodiment, there is provided a semiconductor memory device including a memory cell array including a block of memory cells, gates of which are connected to a plurality of word lines, and a control unit configured to perform a writing operation in response to a command received from the outside, the writing operation including applying a program level voltage to at least two word lines at the same time.

Embodiments are described below referring to the drawings. The description is provided with like parts being given like reference numerals throughout the drawings.

1. First Embodiment

A semiconductor memory device according to a first embodiment is described. A three-dimensional stacked-type NAND flash memory in which memory cell transistors are stacked up on top of one another on a semiconductor substrate will be described below as an example of a semiconductor memory device.

1-1. Configuration of Memory system

First, a configuration of a memory system that includes the semiconductor memory device according to the present embodiment is described referring to FIG. 1.

As is illustrated in FIG. 1, a memory system 1 includes a NAND flash memory 100 and a memory controller 200. For example, a semiconductor device may be formed with several of the memory controllers 200 and the NAND flash memories 100. An example of the memory system 1 could be a memory card such as a secure digital (SD) card, a solid state drive (SSD), or the like. Furthermore, the memory system 1 may further include a host device 300.

The NAND flash memory 100 includes multiple memory cell transistors and data can be stored in a nonvolatile manner in the NAND flash memory 100. A configuration of the NAND flash memory 100 will be described in detail below.

In response to a command from the host device 300, the memory controller 200 issues a command, such as a reading, a writing, or an erasing command, to the NAND flash memory 100.

The memory controller 200 includes a host interface circuit 201, a built-in memory (RAM) 202, a processor (CPU) 203, a buffer memory 204, a NAND interface circuit 205, an error correction code (ECC) circuit 206, and a counter 207.

The host interface circuit 201 is connected to the host device 300 through a controller bus, and manages communication between the memory controller 200 and the host device 300. Then, the host interface circuit 201 transfers a command and data received from the host device 300, to the CPU 203 and the buffer memory 204, respectively. Furthermore, in response to a command from the CPU 203, the host interface circuit 201 transfers data within the buffer memory 204 to the host device 300.

The NAND interface circuit 205 is connected to the NAND flash memory 100 through a NAND bus. The NAND interface circuit 205 manages communication between the NAND flash memory 100 and the memory controller 200. For example, the NAND interface circuit 205 transfers a command from the CPU 203 to the NAND flash memory 100. Furthermore, the NAND interface circuit 205 transfers to-be-written data within the buffer memory 204 to the NAND flash memory 100 and this data is then written to the NAND flash memory 100. Additionally, the NAND interface circuit 205 transfers data that has been read from the NAND flash memory 100 to the buffer memory 202.

The CPU 203 controls operation of the memory controller 200. For example, when receiving a writing command from the host device 300, the CPU 203 issues the writing command to the NAND interface circuit 205 according to an NAND interface protocol. The same is also true for reading and the erasing commands. The CPU 203 also performs various processing operations for managing the NAND flash memory 100, such as "wear leveling" operations. Additionally, the CPU 203 performs various arithmetic operations, such as, data-coding, randomizing, or the like. Even when the host device 300 is included in the memory system 1, the CPU 203 manages the aspects of the operation of the memory system 1 related to operations on or of the NAND flash memory 100.

The ECC circuit 206 performs error checking and correcting of data. That is, for example, the ECC circuit 206 generates a parity bit based on the to-be-written data when data is being written. Similarly, the ECC circuit 206, detects an error when data is being read from the NAND flash memory 100 based on error correction coding (e.g., parity bit information), and operates to correct such errors. The functions of the ECC circuit 206 may be performed by or implemented in CPU 203 in some embodiments.

The built-in memory 202 is a semiconductor memory such as a DRAM, for example, and is used as a working area for the CPU 203. The built-in memory 202 can be used to store firmware for managing the NAND flash memory 100, various management tables, or the like related to operations and functions of the memory system 1. The built-in memory 202 retains a "head point unused word line WL" address for every block address. A block address and a head point unused word line WL will be described in detail below. Furthermore, the built-in memory 202 also retains the number of times (a counter value Nc) that data has been read for each block address without an intervening write/program operation.

The counter 207 increments (increases by one counting value) the counter value Nc that is stored in the built-in memory 202. Specifically, when a read operation is performed on a block (a memory cell group), the counter 207 increments counter value Nc for that specific block. That is, the counter value Nc corresponding to the specific block address being read by the read operation is increased or otherwise changed such that the number of read operations that have been performed on the specific block can be tracked. The counter values Nc can be stored in the built-in memory 202.

When an erasing operation is performed on the specific block, the CPU 203 will reset the counter value Nc for that specific block address previously stored in built-in memory 202.

1-2. Configuration of NAND Flash Memory

Figure 2:
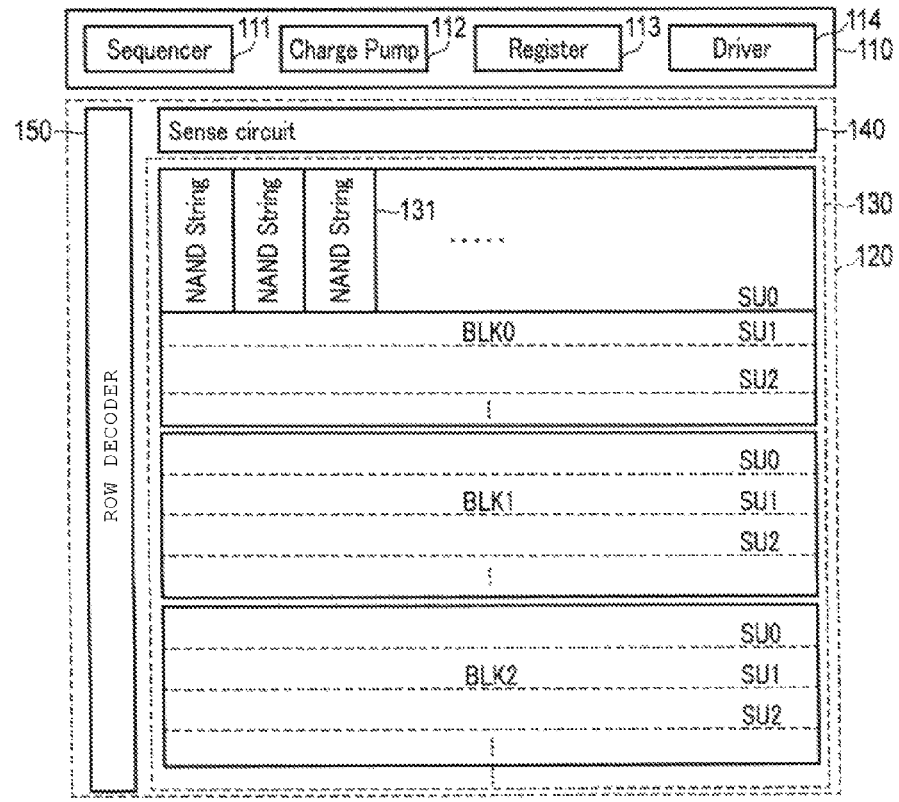
FIG. 2 is a block diagram of a NAND flash memory.

As illustrated in FIG. 2, the NAND flash memory 100 can be generally described as including a peripheral circuit 110 and a core unit 120.

The core unit 120 includes a memory cell array 130, a sense circuit 140, and a row decoder 150.

The memory cell array 130 includes multiple nonvolatile memory cell transistors, and each of the multiple nonvolatile memory cell transistors is associated with a particular word line and a particular bit line. Furthermore, the memory cell array 130 includes multiple (three in the example in FIG. 2) blocks BLK (BLK 0, BLK 1, BLK 2, and so forth) that are groupings of multiple nonvolatile memory cell transistors. The blocks BLK are, for example, units of data erasing, and data stored within the same block BLK are erased in batch.

Data erasing can be performed by a block BLK unit or a unit that is smaller than the block BLK. With regard to an erasing method, for example, there is a disclosure in U.S. patent application Ser. No. 13/235389, filed Sep. 18, 2011, which is titled "NONVOLATILE SEMICONDUCTOR MEMORY DEVICE". Furthermore, there is a disclosure in U.S. patent application Ser. No. 12/694,690 filed Jan. 27, 2010, which is titled "NON-VOLATILE SEMICONDUCTOR STORAGE DEVICE". Additionally, there is a disclosure in U.S. patent application Ser. No. 13/483,610 filed May 30, 2012, which is titled "NONVOLATILE SEMICONDUCTOR MEMORY DEVICE AND DATA ERASE METHOD THEREOF". These Patent Applications are incorporated in their entireties into the present specification by reference.

Each of the block BLK includes multiple string units SU (SU 0, SU 1, SU 2, and so forth) that are groups of NAND strings 131 that each comprise memory cell transistors connected to one another in series. Of course, the number of blocks within the memory cell array 130 or the number of string units SU within one block BLK is arbitrary and can be varied in different embodiments. An indication of a particular position of a block within the memory cell array 130 is referred to as a block address.

The row decoder 150 selects a word line for any one of blocks that correspond to the block address of an addressed or target memory cell transistor.

The sense circuit 140 includes multiple sense modules (not separately illustrated). When reading the data, the sense modules sense the data that is read from the memory cell transistors to the bit line.

The peripheral circuit 110 includes a sequencer 111, a charge pump 112, a register 113, and a driver 114.

The sequencer 111 controls internal operations of the NAND flash memory 100.

The charge pump 112 boosts a power source voltage that is supplied from the outside and supplies necessary voltage (s) to the driver 114.

The register 113 retains/stores various signals as required. For example, the register 113 retains a current status of a data writing or data erasing operation, which can be used to notify a controller whether or not the operation has been completed normally. Furthermore, the register 113 is also capable of retaining various tables.

The driver 114 supplies voltages necessary for the data writing, reading, and erasing operations to the row decoder 150, the sense circuit 140, and a source line driver circuit (not separately illustrated).

1-3. Memory Cell Array

Figure 3:
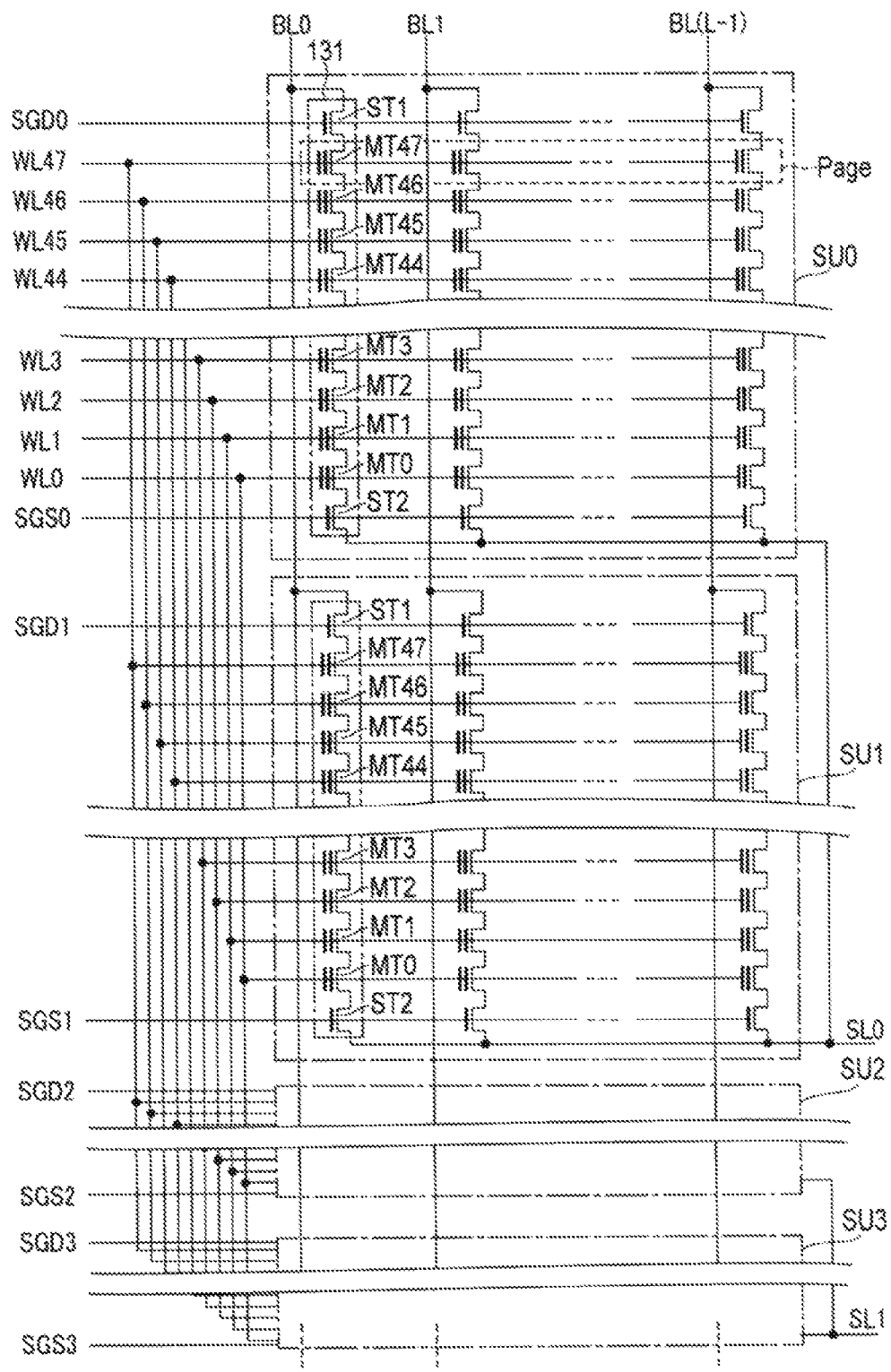
FIG. 3 is a diagram illustrating a configuration of a memory cell array.

Next, a configuration of the above-described block BLK is described with referring to FIG. 3. As illustrated in FIG. 3, a block BLK includes, for example, four string units SU (SU 0 to SU 3), each of which includes multiple NAND strings 131.

Each of the NAND strings 131, for example, includes 48 memory cell transistors MT (MT 0 to MT 47) and selection transistors ST 1 and ST 2. The memory cell transistors MT each include a control gate and a charge storage layer. The memory cell transistors MT are connected in series between a source of the selection transistor ST 1 and a drain of the selection transistor ST 2.

Gates of the selection transistors ST 1 in the string units SU 0 to SU 3 are connected to selection gate lines SGD 0 to SGD 3, respectively. Gates of the selection transistors ST 2 in the different string units SU 0 to SU 3 can be connected in common to one selection line, in some examples. In other examples, such as depicted in FIG. 3, the gates of the selection transistors ST 2 may be connected to different selection lines (SGS 0 to SGS 3) for every string unit. Furthermore, control gates of the corresponding memory transistors MT 0 to MT 47 within the same block BLK are connected to word lines WL 0 to WL 47, respectively, in a shared manner. That is, each memory transistor MT0 of each string unit SU within the same memory block BLK is connected to word line WL0, etc.

Furthermore, drains of the selection transistors ST 1 in the NAND string 131 in the same column within the memory cell array 130 are connected in common to a corresponding one of the bit lines BL (BL 0 to BL (L-1), where (L-1) is a natural number that is equal to or greater than 2). That is, the bit lines BL connect the NAND string 131 in the multiple blocks BLK in a shared manner. Additionally, sources of the multiple selection transistors ST 2 are connected in common to a source line SL.

Figure 4:
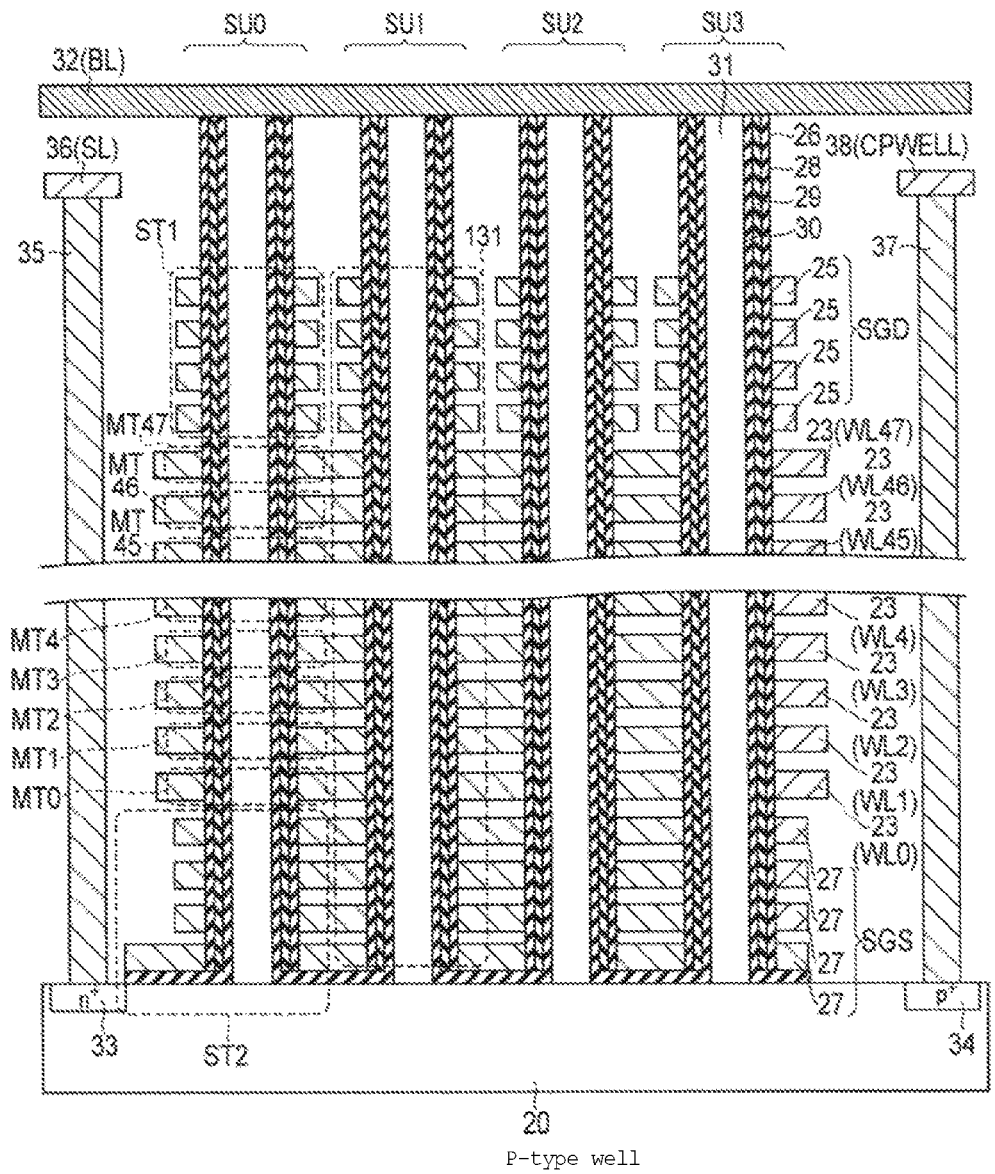
FIG. 4 is a cross-sectional diagram of the NAND flash memory.

FIG. 4 is a cross-sectional diagram of one region of the block BLK. As illustrated, multiple NAND strings 131 are formed on a P-type well region 20. That is, for example, a 4-layered wiring layer 27 that functions as the selection gate line SGS, a 48-layered wiring layer 23 that functions as the word lines WL 0 to WL 47, and, for example, a 4-layered wiring layer 25 that functions as the selection gate line SGD are sequentially stacked on the well region 20. An insulating film that is not specifically illustrated may be formed between the stacked wiring layers.

A pillar-shaped semiconductor layer 31 that passes through the wiring layers 25, 23, and 27, and reaches the well region 20 may be formed. A gate insulating film 30, a charge storage layer (an insulating film) 29, and a block insulating film 28 are formed sequentially on a flank (lateral) surface of a semiconductor 31, and thus the memory cell transistor MT and the selection transistors ST 1 and ST 2 are formed. The semiconductor 31 functions as an electric current path for the NAND string 131 and is a region in which a channel of each transistor is formed. Then, an upper end of the semiconductor 31 is connected to a metal wiring layer 32 that functions as the bit line BL.

An $n^+$ type impurity diffusion layer 33 is formed within a surface region of the well region 20. A contact plug 35 is formed on the diffusion layer 33, and the contact plug 35 is connected to a metal wiring layer 36 that functions as the source line SL. Additionally, a $p^+$ type impurity diffusion layer 34 is formed within the surface region of the well region 20. A contact plug 37 is formed on the diffusion layer 34, and the contact plug 37 is connected to a metal wiring layer 38 that functions as well wiring CPWELL. The well wiring CPWELL is a wiring for applying an electric potential to the semiconductor 31 through the well region 20.

Two or more of the configurations described above are arranged along the direction into the page of which FIG. 4 (depth direction), and a set of NAND strings 131 that runs in along this depth direction forms a string unit SU.

Additionally, when it comes to the configuration of the memory cell array 130, other configurations are possible. That is, when it comes to the internal configuration of the memory cell array 130, for example, there is also disclosure in U.S. patent application Ser. No. 12/407,403 filed Mar. 19, 2009, which is titled "THREE DIMENSIONAL STACKED NONVOLATILE SEMICONDUCTOR MEMORY". Furthermore, there are disclosures in U.S. patent application Ser. No. 12/406,524, filed Mar. 18, 2009, which is titled THREE DIMENSIONAL STACKED NONVOLATILE SEMICONDUCTOR MEMORY, U.S. patent application Ser. No. 12/679,991, filed Mar. 25, 2010, which is titled "NON-VOLATILE SEMICONDUCTOR STORAGE DEVICE AND METHOD OF MANUFACTURING THE SAME", and U.S. patent application Ser. No. 12/532,030, filed Mar. 23, 2009, which is titled "SEMICONDUCTOR MEMORY AND METHOD FOR MANUFACTURING SAME". These Patent Applications are incorporated in their entireties into the present specification by reference.

1-4. Threshold Voltage Distribution of Memory Cell Transistors 1-4-1. Relationship between Threshold Voltage Distribution and Data of Memory Cell Transistors FIG. 5 illustrates data and a threshold voltage distribution for which the memory cell transistors MT according to the present embodiment may have as an example.

Figure 5:
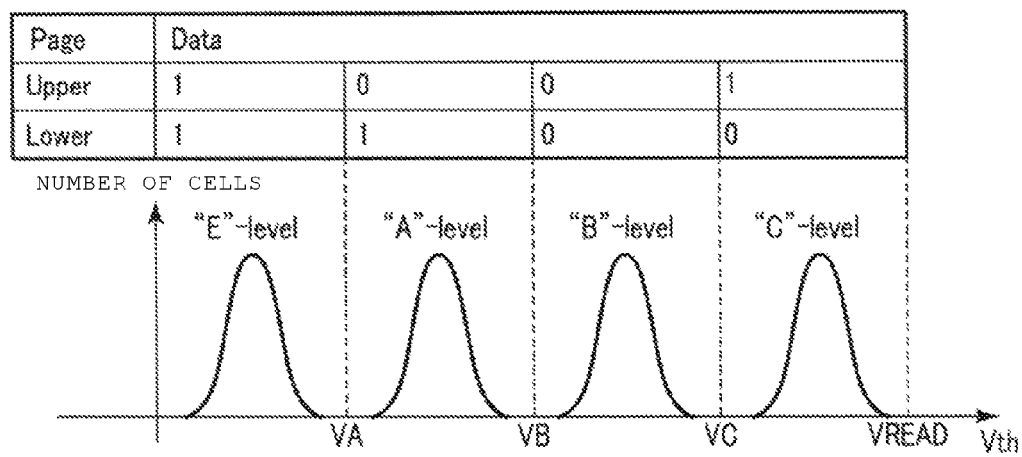
FIG. 5 is a table and a graph illustrating a threshold distribution of a memory cell transistor.

As illustrated in FIG. 5, each memory cell transistor MT is capable of retaining, for example, two-bit data according to a threshold voltage established therein. Pieces of two-bit data would be, for example, "11", "01", "00", and "10" values in order of increasing threshold voltage.

A threshold voltage of a memory cell that retains data of "11" is referred to here as an "E" level. The E level corresponds to a threshold voltage state where electric charge flow out of the charge storage layer and thus any stored data would be erased or lost. The E level can be a positive or negative value (which, for example, is less than voltage VA).

The values "01", "00", and "10" correspond to threshold voltages levels at which an electric charge flows into the charge storage layer and thus data is written by the retention of charge in the charge storage layer. A threshold voltage level of a memory cell that retains data of "01" is referred to as an "A" level, and is a threshold voltage level which is equal or greater than voltage VA, but less than VB, (VA<VB). The "A" level is higher than the "E" level. A threshold voltage of a memory cell that retains data of "00" is referred to as a "B" level, and is a threshold voltage level that is higher than the "A" level, but less than voltage VC (VB<VC). A threshold voltage of a memory cell that retains data of "10" is referred to as a "C" level, and is a threshold voltage level that is higher than the "B" level, but less than or equal to the voltage VREAD.

A relationship between the two-bit data and the threshold voltage levels is not particularly limited to this example relationship. For example, a case where the data of "11" corresponds to the "C" level may be adopted, and the relationship between threshold voltage level and the corresponding data can be varied in some embodiments. Furthermore, each of the memory cell transistors MT in this example are set to be capable of retaining the two-bit data, but the present disclosure is not limited to this and the memory cell transistors MT in some embodiments can be other than two-bit data storage elements.

1-4-2. Change in Threshold Voltage Distribution of Memory Cell Transistors

A possible change in the threshold voltage distribution of the memory cell transistors is described with reference to FIGS. 6A, 6B, and 6C.

As illustrated in FIG. 6A, in some cases, in a certain string of a certain block, particular data is written into to the memory cell transistors MT 0 through MT 2, and the memory cell transistors MT 3 to MT 47 are not written with data and remain in an unused state (i.e., in an erased state or in an "E" level state), and subsequently this string of the block might be left in this condition (e.g., MT 0 through MT 2 in a written state and MT 3 to MT 47 in an erased state) for a relatively long time.

In some cases, the data that has been stored in this string of this block is then subsequently erased after this relatively long time period, and thereafter other data might be written to this block. In this case, as illustrated in FIG. 6B, a threshold voltage distribution of memory cell transistors MT to which pieces of data have been written (e.g., MT 0 to MT 2) might be the same as the threshold voltage distribution for this block at the point in time before the block had been left for the relatively long time. On the other hand, as illustrated in FIG. 6C, if the block is left for the long time is subsequently erased and data is then written to this block, there is a likelihood that the threshold voltage distribution of the memory cell transistors MT left in the unused state (e.g., MT 3 to MT 47) will have shifted and/or be broadened, as depicted by the dashed line in FIG. 6C. In this manner, the memory cell transistors MT left in the unused (erased) state in the block are unintentionally left in a condition in which there is a likelihood that the data retention properties of the individual memory cell transistors MT will be degraded by the long term storage of "E" level data before a reprogramming.

According to the first embodiment, a data writing operation is performed sequentially on the memory cell transistors MT, starting from first memory cell transistor MT on the source line side.

As such, the "head point unused word line" means the word line WL that is connected to a gate electrode of the memory cell transistor MT that is closest to the source line end among the set of adjacent memory cell transistors MT in the string which has not been written with data (has the "E" level threshold voltage). Therefore, in this specific example, where data was written to memory cell transistors MT0, MT1, and MT2 in the specific string of concern, the word line WL 3 would be the "head point unused word line" since data was not specifically written to memory cell transistors MT3 to MT47.

1-5. Operation

Figure 7:
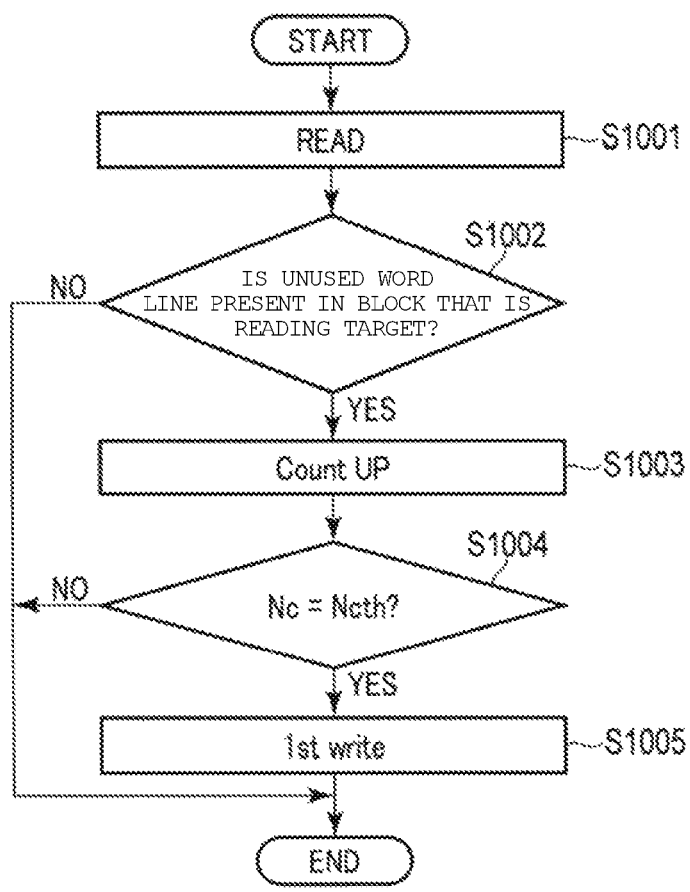
FIG. 7 is a flowchart relating to aspects of the operation of a semiconductor memory device according to a first embodiment.

An operation according to the first embodiment is described with reference to FIG. 7. According to the first embodiment, multiple memory cell transistors MT which are in the unused state and adjacent to each along a string in a block are preferably not left in the unwritten/erased state for longer than some fixed period of time so as to avoid changes/degradation in operating characteristics of these unwritten memory cell transistors MT. Specifically, in this first embodiment, a writing process is performed (in batch) on these memory cell transistors MT left in the unused state after some period of time.

S1001

When receiving a reading request from the host device 300, the memory controller 200 transmits a reading command and an address to the NAND flash memory 100.

The NAND flash memory 100 performs the read operation on a memory cell transistor MT that corresponds to the address.

S1002

The CPU 203 determines whether or not a head point unused word line in the presently addressed block, which is the reading target, has been established. For example, information on whether or not the head point unused word line is present in the addressed block can be stored in the RAM 202. The CPU 203 performs a determination operation by accessing the RAM 202. When it is determined that a head point unused word line is not present in the addressed block (NO in S1002), the CPU 203 ends the present operation without performing the first writing operation (see S1005).

S1003

When the CPU 203 determines that the head point unused word line is present in the addressed block (Yes in S1002), the CPU 203 supplies the counter value Nc (corresponding to the address) that is stored in the built-in memory 202 to the counter 207. The counter 207 counts up (increments) the received counter value Nc (i.e., new Nc value becomes equal to received Nc value+1).

S1004

After the counter 207 increments the counter value Nc, the CPU 203 determines whether or not the new counter value Nc is equal to a first value Ncth. When it is determined that the not counter value Nc is still not the first value Ncth (NO in S1004), the CPU 203 stores the new counter value Nc in the built-in memory 202.

S1005

When it is determined that the counter value Nc is equal to first value Ncth (YES in S1004), the CPU 203 performs the first writing operation on the block (the addressed block) from which the data was read in S1001. Furthermore, the CPU 203 resets the counter value Nc and stores the reset counter value Nc in the built-in memory 202.

The memory system 1 thus counts the number of times that a reading of each particular block has been performed, and determines whether or not the number of times (e.g., counter value Nc) for the block has reached a predetermined number of times (e.g., first value Ncth).

As described above, according to the first embodiment, it is assumed that the several adjacent multiple memory cell transistors MT in a string should preferably not be left in an unused state for greater than some fixed period of time during normal operations. However, when not in operation, the memory system 1 might power itself off to reduce power consumption, for example. When the memory system 1 is powered off, the memory system 1 cannot effectively measure the elapsed time while powered off. For this reason, it is considered that in the memory system 1 according to the first embodiment, the number of times for which a reading has been performed can be used as an acceptable proxy value for the actual elapsed time period for which the multiple memory cell transistors MT have been left in an unwritten state, and it is thus unnecessary to measure the actual elapsed time for which the multiple memory cell transistors MT have been left unwritten. This proxy usage is considered acceptable here because it may be assumed that for a block in which the number of times that reading is performed is large, the writing and/or the erasing of data might not be performed for a relatively long time.

1-6. First Writing Operation

The first writing operation is an operation that performs a data writing operation in a batch process on the memory cell transistors MT connected to different word lines. Usually, in the writing of data to a memory cell transistor MT, both a programming operation and a program verification operation are performed. However, in the first writing operation, the program verification operation is not required.

1-6-1. Command Sequence

A command sequence relating to the first writing operation is described with reference to FIG. 8. When performing the first writing operation, the memory controller 200 issues a command "XXH" that designates the head point unused word line address and asserts ("H"-levels) a signal CLE. In succession to the command "XXH", the memory controller 200 issues an address "YYH" (for one cycle) that indicates the head point unused word line. The memory controller 200 can designate the head point unused word line by transmitting the command "XXH" and the address "YYH". Subsequently, the memory controller 200 issues a writing command "80H".

The memory controller 200 issues, for example, addresses (CA: a column address and RA: row address) over five cycles, and asserts ("H"-levels) a signal ALE. In the meantime, the signal CLE is negated ("L"-leveled). These commands and addresses each are stored, for example, in the register 113.

Next, the memory controller 200 issues a writing command "10H" and asserts the CLE. In response to the storing of the command "10h" in the register 113, the sequencer 111 starts the first writing operation, and the NAND flash memory 100 enters a busy state (RBn="L").

Whenever issuing signals such as a command, an address, and data, the memory controller 200 toggles ("H"-level to "L"-level) WEn. Then, whenever WEn is toggled, a signal is taken into the NAND flash memory 100.

Upon receiving the command "10H", the NAND flash memory 100 can perform the first writing operation in a simultaneous batch process on all the memory cell transistors MT from the head point unused word line (the particular word line WL that was designated by "YYH") to the end point unused word line (which can be separately designated or otherwise determined) in all the string units of a selected block. Additional aspects of the first writing operation on the selected block will be described. In this context, the "end point unused word line" means a word line WL that is connected to a gate electrode of a memory cell transistor that is closest to the bit line among the group of adjacent memory cell transistors MT to which pieces of data have not been written.

Figure 8:
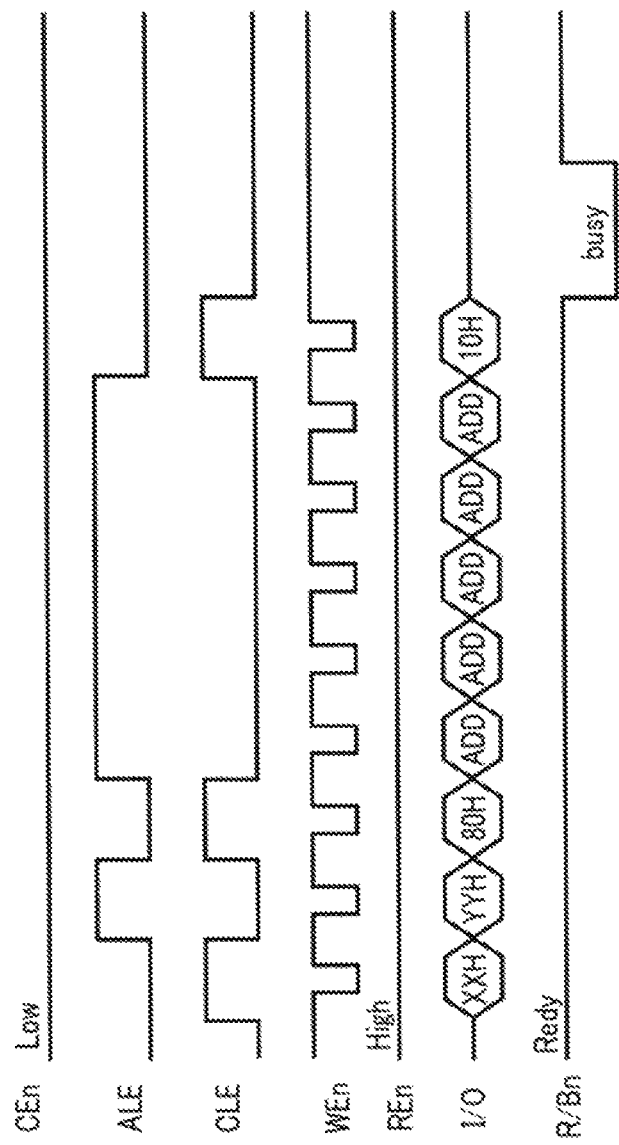
FIG. 8 is a command sequence of a first writing in the semiconductor memory device according to the first embodiment.
Figure 9:
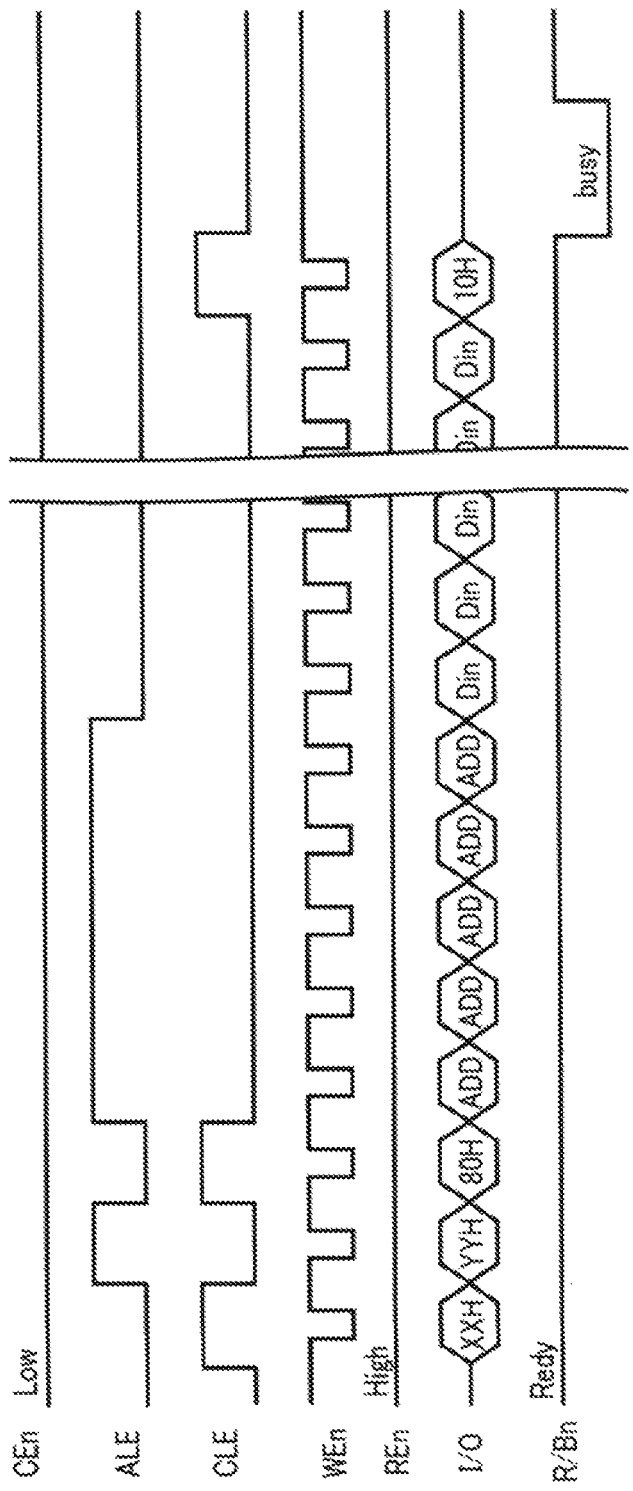
FIG. 9 is another command sequence of the first writing in the semiconductor memory device according to the first embodiment.

In an example that is illustrated in FIG. 8, to-be-written data (specifically instructed write data) is not input from the memory controller 200 into the NAND flash memory 100 for the first writing operation. However, as illustrated in FIG. 9, after the address is input, the memory controller 200 may input to-be-written data Din to be written into the NAND flash memory 100 if desired. The to-be-written data Din that is received in the NAND flash memory 100 would be retained in a page buffer within the sense circuit 140. Then, when the command "10H", the NAND flash memory 100 can perform the first writing operation using to-be-written data Din.

1-6-2. Waveform Chart

A waveform chart of a case where the first writing is performed on selected word lines WL (i.e., from the head point to end point unused word line) in all the string units SU is described with reference to FIG. 10. The selected word lines WL-SEL is the group of word lines WL from the head point unused word line to the end point unused word line previously identified (in the current example, word lines WL 3 to WL 47 would be the word lines WL-SEL).

Point in Time T0

Figure 10:
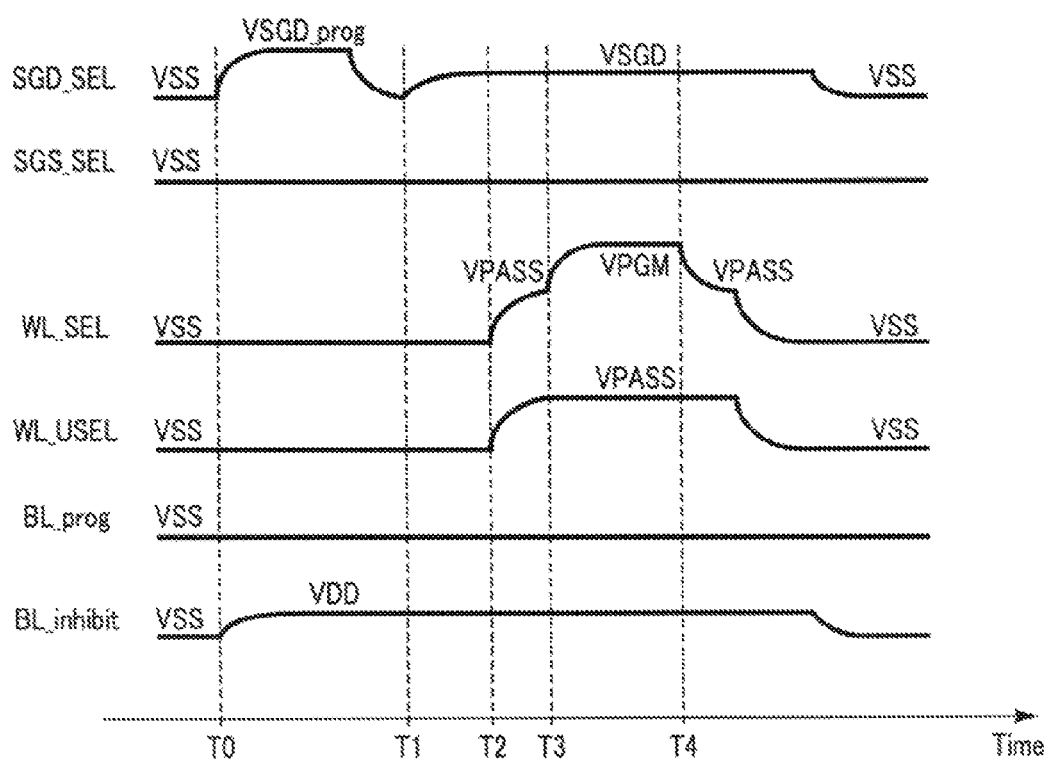
FIG. 10 is a wave form of the first writing in the semiconductor memory device according to the first embodiment.

As illustrated in FIG. 10, the row decoder 150 at time T0 selects a block in accordance with the row address RA that is given from the register 113. Then, the row decoder 150 applies a voltage "_VSGD grog" (for example, VSGD_grog>VSS) to a selection gate line SGD_SEL that has been selected. The voltage "VSGD_grog" causes the selection transistor ST 1 to be in an ON state. Additionally, the row decoder 150 applies a voltage "VSS" to the selection gate line SGS_SEL that has been selected.

Furthermore, the sense circuit 140 applies, for example, the voltage "VSS" to a writing bit line BL_grog from which electrons will be injected into the charge storage layer of the memory cell transistor MT connected thereto, and applies a positive voltage "VDD" (VDD>VSS) to a non-writing bit line BL_inhibit which suppresses/inhibits electrons from being injected into the charge storage layer of the memory cell transistor MT connected thereto.

Point in Time T1

The row decoder 150 at time T1 applies a voltage "VSGD" to the selection gate line SGD_SEL (for example, VSGD_grog>VSGD>VSS). The voltage "VSGD_prog" causes a voltage "Vb1" to be able to be transferred to the selection transistor ST 1. The voltage "VSGD" causes the voltage "VSS" to be able to be transferred to the selection transistor ST1, but causes the voltage "Vb1" not to be able to be transferred. Consequently, the selection transistor ST 1 that corresponds to the non-writing bit line BL_inhibit enters a non-conductance state.

Point in Time T2

The row decoder 150 at time T2 applies a voltage "VPASS" to word lines WL (WL_SEL and WL_USEL).

Point in Time T3

The row decoder 150 increases a voltage that is applied to the selected word lines WL-SEL from "VPASS" to "VPGM". Thus, electrons are injected into the memory cell transistors MT that are connected to the selected word lines WL_SEL in the selected/addressed block. The operation of applying the voltage "VPGM" to the selected word lines WL (WL_SEL) in this manner is referred to as the program operation. The specific voltage "VPGM" value that is applied to the selected word line(s) WL in this program operation can be varied.

The application of the voltage "VPASS" causes memory cell transistors MT to be in the ON state regardless of their data retention state. Furthermore, the voltage "VPGM" is a sufficiently high voltage that is able to cause electrons to be injected into the charge storage layer 29 via FN (Fowler-Nordheim) tunneling. Thus, electrons are injected into the charge storage layer 29 of the memory cell transistors MT connected to the selected word lines WL_SEL.

The voltage of each wiring is set to "VSS" at time T4 after the programming operation during the period of time from time T3 to time T4 has been completed.

An purpose of the first writing operation is to inject an electric charge into the charge storage layers of the group of unused memory cell transistors MT in the block that have been left for a long time in an "E" level state. To be more precise, the purpose of the first writing is not to write any particularly desired data per se to the memory cell transistor MT, but rather to limit possible degradation in operating characteristics resulting from a memory cell transistor MT being in an unused state for long periods. For this reason, the threshold voltage of the memory cell transistor MT that results after the voltage "VPGM" is applied in the first writing operation may be any threshold voltage value. As a result, program verification is unnecessary in the first writing operation because whether a specific threshold voltage level has been obtained for these memory cell transistors is generally immaterial.

In FIG. 10, a case where the first writing operation is performed on all the string units SU in a selected block is described, but in some embodiments a specific string (or specific strings) in the selected block may be selected and the first writing operation might be performed only on those the specifically selected string(s).

1-7. Effect

According to the first embodiment described above, the memory system 1 at some point performs programming in batch on the charge storage layer of unused memory cell transistors based on the number of times that a reading has been performed on a block including the memory cell transistors. Furthermore, the memory system 1 does not perform the program verification after this batch program step on the unused memory cell transistors.

Thus, the time taken to perform the writing to unused memory cell transistors can be shortened. The writing to the unused memory cell transistors is performed on a batch of memory cell transistors that are adjacent to each other along a memory string. By performing this writing operation on the otherwise unused memory cell transistors, the unused memory cell transistors are, in effect, reused before too long of a time elapses between storage events. It is thus possible to limit changes in the threshold voltage distribution of the unused memory cells that might otherwise occur by being left unused/unwritten for a long time.

To be more precise, according to the first embodiment described above, an electric charge retention property is maintained in the memory cell array for a later time when the unused memory cell transistors are eventually reused.

Furthermore, as described in section 1-4-2, the more memory cell transistors MT that are in an erased state, the more easily or significantly the change in the threshold voltage distribution might be caused. For example, it might be expected that a greater effect is caused by applying the first writing operation to four or more memory cell transistors MT in an erased state along a string than to less than four memory cell transistors MT in the erased state along the string.

1-8. First Modification Example

Figure 11:
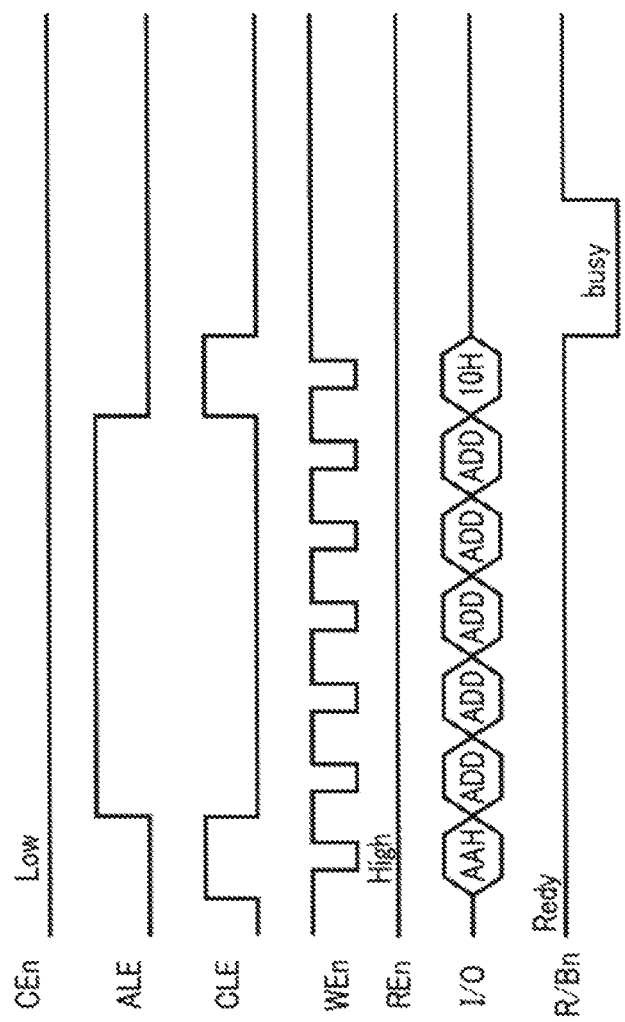
FIG. 11 is a command sequence of the first writing in a semiconductor memory device according to a first modification of the first embodiment.

First, a first modification example of the command sequence relating to the first writing operation is described with referring to FIG. 11.

When performing the first writing, the memory controller 200 issues a command "AAH" that designates the head point unused word line address and asserts the signal CLE. The memory controller 200 issues, for example, addresses (CA: a column address and RA: row address) that designates the head point unused word line WL, over five cycles, and asserts the signal ALE. In the meantime, the signal CLE is negated.

Next, the memory controller 200 issues the writing command "10H" and asserts the CLE. In response to the storing of the command "10H" in the register 113, the sequencer 111 starts the first writing operation, and the NAND flash memory 100 enters the busy state. When receiving the command "10H", the NAND flash memory 100 can perform the writing in batch on the head point unused word line (the word line WL that is designated by the received address) in a predetermined grouping to the end point word line.

Figure 12:
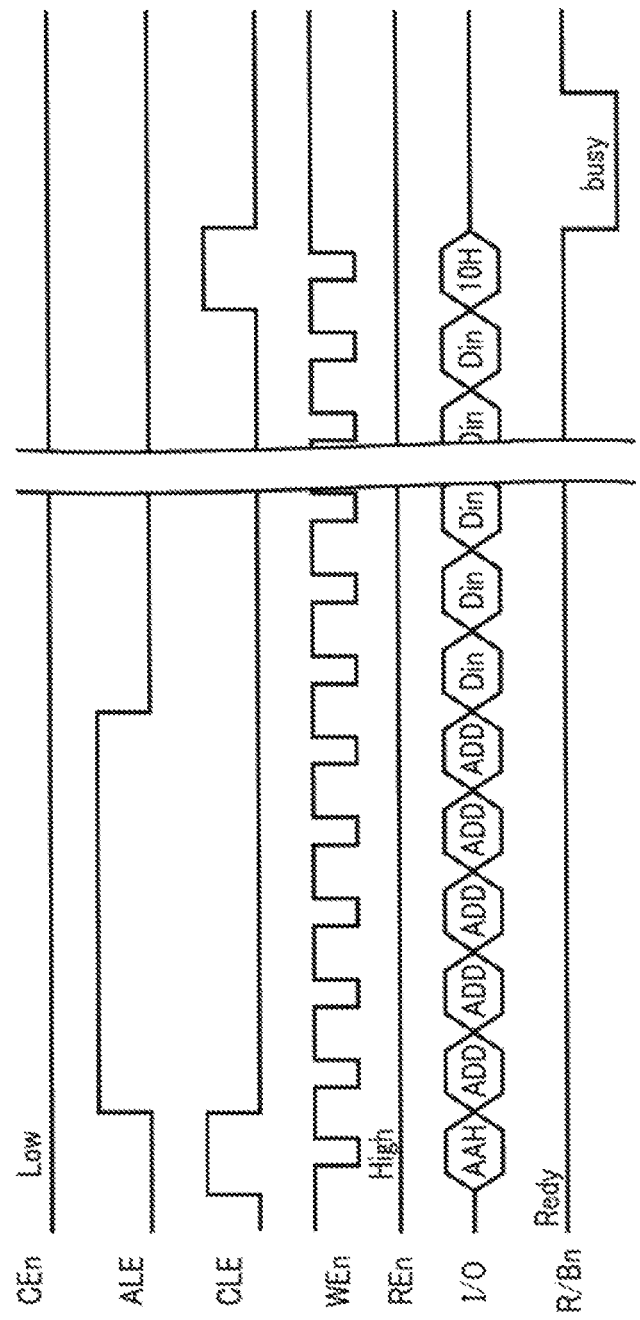
FIG. 12 is another command sequence of the first writing in the semiconductor memory device according to the first modification of the first embodiment.

In an example that is illustrated in FIG. 11, the to-be-written data is not input from the memory controller 200 into the NAND flash memory 100. However, as illustrated in FIG. 12, after the address is input, the memory controller 200 may input the to-be-written data Din into the NAND flash memory 100.

1-9. Second Modification Example

Next, a second modification example of the command sequence is described.

1-9-1. Outline

According to the first embodiment described above, in succession to the command "XXH", the address "YYH" for one cycle that indicates the head point unused word line is issued.

Figure 13:
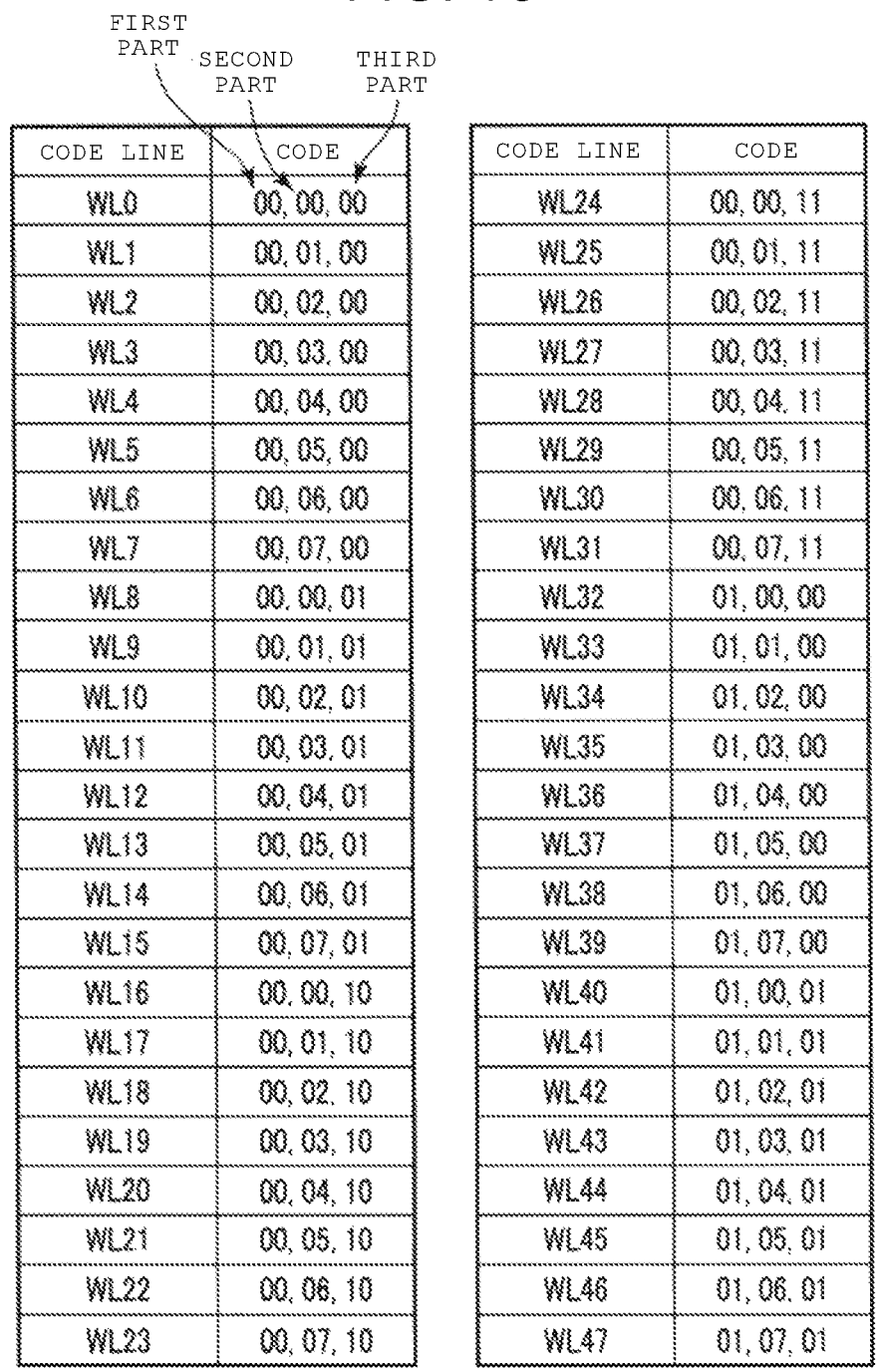
FIG. 13 is a code table relating to word lines.

However, in some cases, due to specifications for the memory system and the like, the head point unused line cannot be designated with just one cycle. Accordingly, as illustrated in FIG. 13, a code may be prepared in advance for every possible word line WL. Here, the group of codes that are prepared for every word line WL is also described as a "code table." This code table can be retained, for example, in the built-in memory 202. The memory controller 200 can designate the word line WL from which the first writing operation is to be performed by inputting a code that is illustrated in FIG. 13 after a predetermined command. In FIG. 13, each code includes three parts (a first part, a second part, and a third part). A code table that is illustrated in FIG. 13 is one example, and various modifications to the code are possible. Furthermore, the number of word lines WL is not limited to 48, and for example, may be smaller or greater than 48. When the number of word lines WL increases, a code maybe suitably added as the number of word lines WL increase.

1-9-2. Command Sequence

Figure 14:
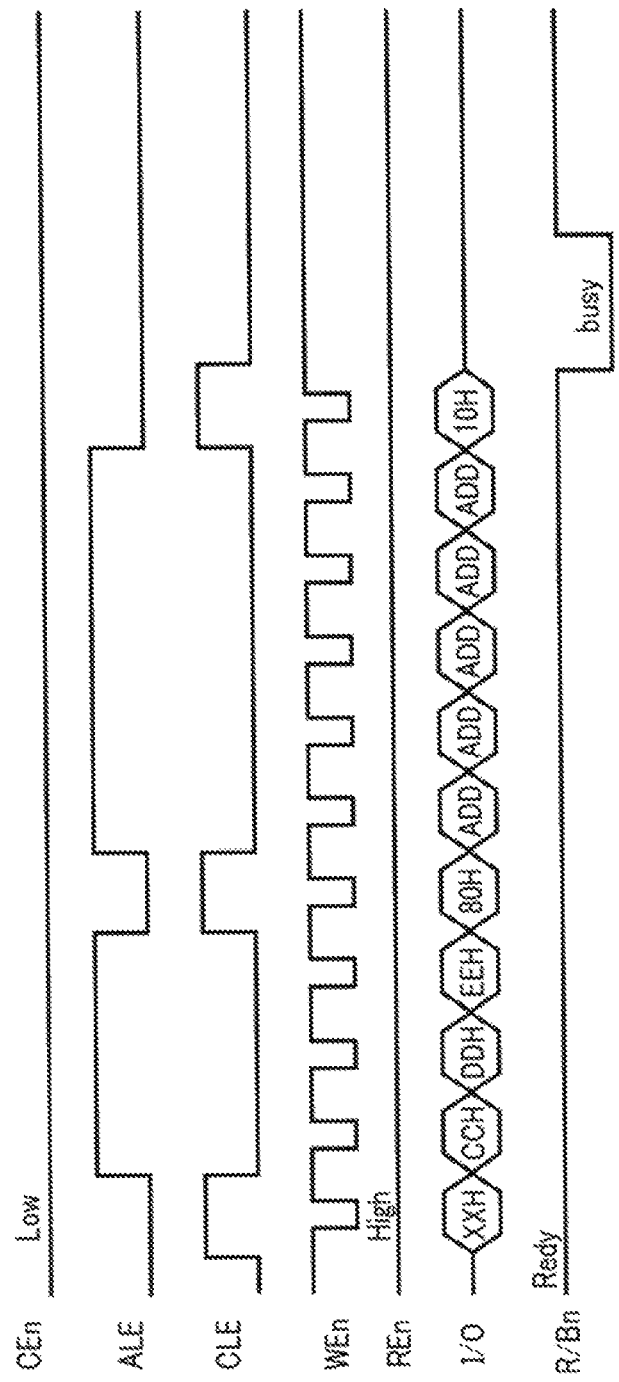
FIG. 14 is a command sequence of the first writing in a semiconductor memory device according to a second modification of the first embodiment.

The command sequence relating to the first writing is described with referring to FIG. 14. When performing the first writing, the memory controller 200 issues a command "XXH" that designates the head point unused word line address and asserts the signal CLE. For example, based on the code table that is stored in the built-in memory 202, the memory controller 200 issues the first part "CCH", the second part "DDH", and the third part "EEH" of the code. The NAND flash memory 100 receives the first part to the third part of the code in this order over three cycles. Thus, based on the first part to the third part of the code, which are received, the NAND flash memory 100 can recognize the intended head point unused word line. Subsequently, the memory controller 200 issues the writing command "80H".

The memory controller 200 issues, for example, addresses over five cycles, and asserts the signal ALE. In the meantime, the signal CLE is negated.

Next, the memory controller 200 issues the writing command "10H" and asserts the CLE.

When receiving the command "10H", the NAND flash memory 100 can perform the writing in batch on the head point unused word line (the word line WL that is designated by the command "XXH", and the first part "CCH", the second part "DDH", and the third part "EEH" of the code) in a predetermined grouping to the end point unused word line.

Figure 15:
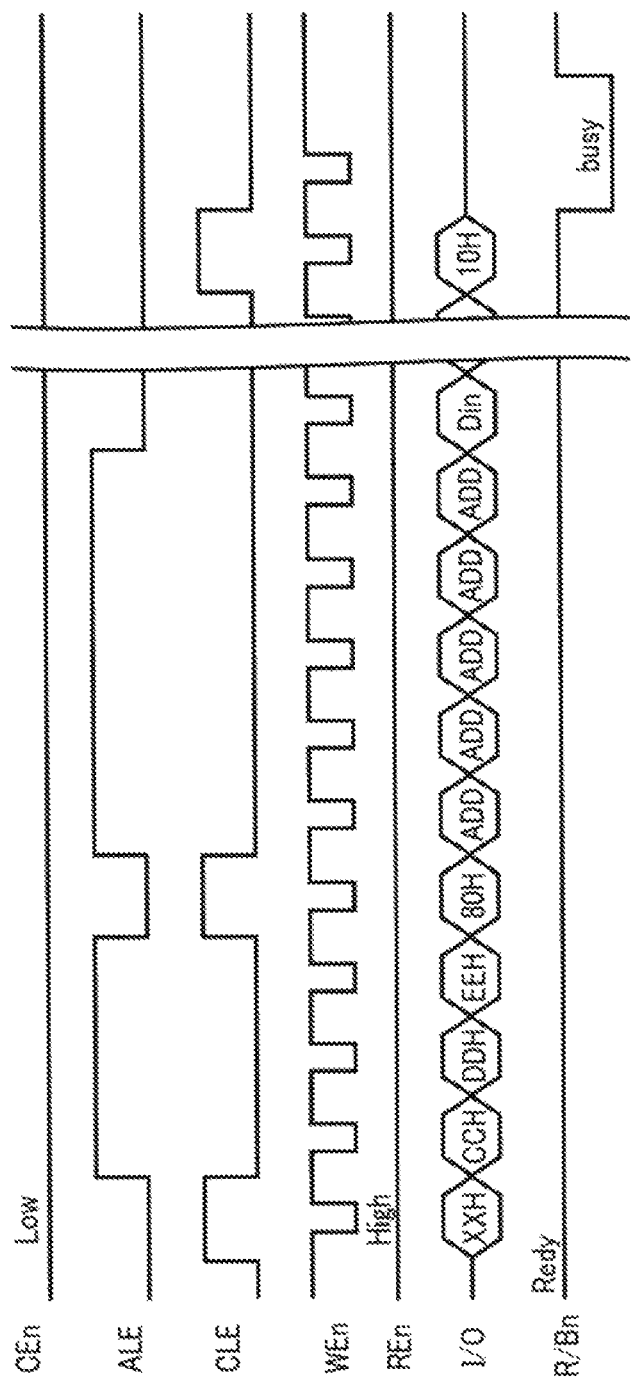
FIG. 15 is another command sequence of the first writing in the semiconductor memory device according to the second modification of the first embodiment.

In an example that is illustrated in FIG. 14, the to-be-written data is not input from the memory controller 200 into the NAND flash memory 100. However, as illustrated in FIG. 15, after the address is input, the memory controller 200 may input the to-be-written data Din into the NAND flash memory 100.

2. Second Embodiment

According to the second embodiment, there is a case where there is a limitation on the number of memory cell transistors MT that can be programmed in batch. A basic configuration and basic operation of a storage device according to the second embodiment are similar to those of the storage device according to the first embodiment described above.

2-1. Outline

For the first writing operation in the second embodiment, there is a limitation on the number of memory cell transistors MT that can be programmed at one time in batch. In some cases, the number of unused memory cell transistors might be greater than the number of memory cell transistors that can be programmed at one time in batch. In such cases, there would be a need to perform the first writing operation multiple times. When the first writing operation is to be performed multiple times, there will be a need to designate which word lines WL still remain to be programed after the previous performance (s) of the first writing operation.

2-2. Operation

Figure 16:
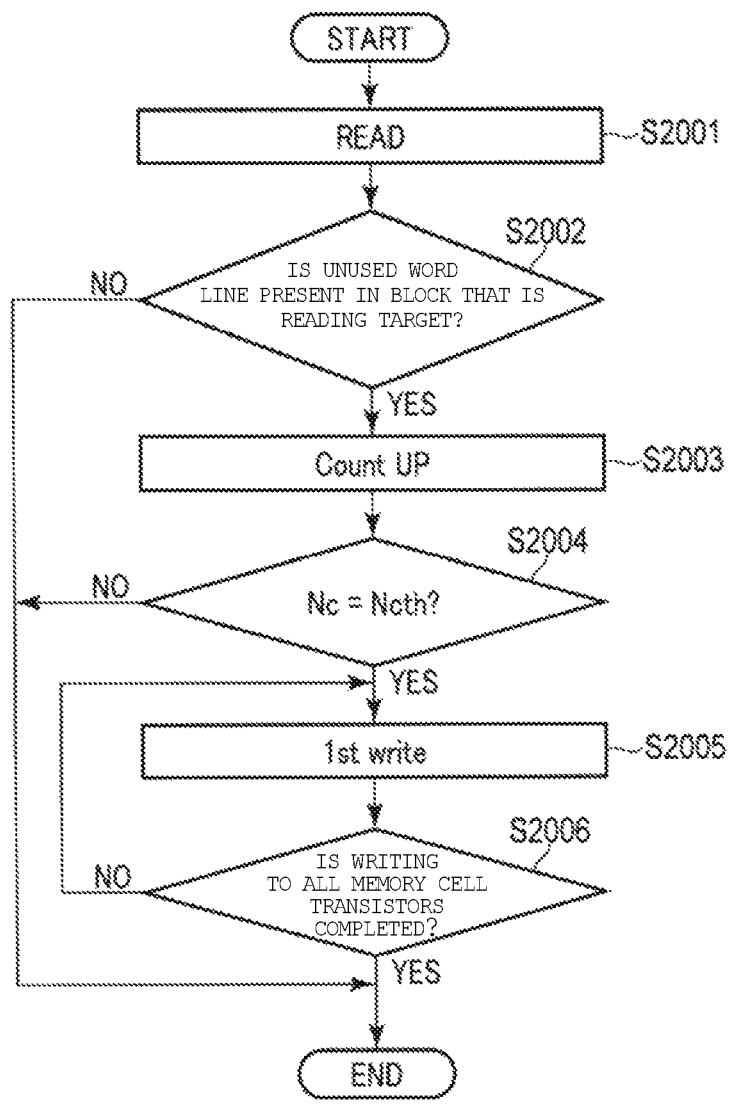
FIG. 16 is a flowchart relating to aspects of the operation of a semiconductor memory device according to a second embodiment.

An operation according to the second embodiment is described with referring to FIG. 16.

S2001 to S2005

Aspects S2001 to S2005 are substantially the same as aspects S1001 to S1005 described above with respect to the first embodiment.

S2006

After S2005 is completed, the CPU 203 determines whether or not all the memory cell transistors that are targets for the first writing has been completed. When the CPU 203 determines that the first writing is not completed (NO in S2006), the CPU 203 repeats S2005. Furthermore, when the CPU 203 determines that the first writing is completed (YES in S2006), the CPU 203 resets the counter value Nc and stores the reset counter value Nc in the built-in memory 202.

2-3. Word Line Group

Next, a word line group is described. At this point, in a first program operation, the driver 114 can apply the voltage "VPGM" simultaneously to "Z" (where "Z" is an integer) word lines WL. According to the second embodiment, the number ("Z") of word lines to which the voltage "VPGM" can be applied simultaneously has been previously determined. According to the second embodiment, multiple word line groups are prepared corresponding to groups of "Z" or less total word lines. Thus, here each word line group can be said to include "A" (where "A" is an integer less or equal to than "Z") word lines. The driver 114 is configured in such a manner that the voltage "VPGM" can be applied to each of the "A" total word lines in a word line group at the same time.

For example, the word lines WL 0 to WL "M" (where "M" is an integer) can be divided into a total of "N" word line groups (where "N" is an integer). In this case, starting from the word line WL 0, the word lines are sequentially grouped in groups with "A" total word lines into a first group (e.g., the word lines WL 0 to WL A-1), a second group (e.g., WL A to WL 2A), up to an (N-1)-th group (WL M-2A-1 to WL M-A-1), and an N-th group (WL M-A to WL M).

2-4. First Writing Operation

Next, a first writing operation according to the second embodiment is described.

In a NAND flash memory 100 according to the second embodiment, the first writing operation is sequentially performed on every word line group starting from the first group.

When performing the first writing operation, the NAND flash memory 100 first performs an operation in which the voltage "VPGM" is applied to word lines in a) group that includes the previously identified head point unused word line.

Specifically, the driver 114 applies the voltage "VPGM" to those word lines WL in the word line group that are closer to the bit line than is the head point line WL within the word line group. In other words, the driver 114 does not apply the voltage "VPGM" to those word lines WL that are closer to the source line than the head point unused word line within the word line group.

Then, the NAND flash memory 100 performs applies the voltage "VPGM" to all the word lines WL in a next word line group that is adjacent to the first group that included the head point unused word line along the direction of the bit line. The NAND flash memory 100 eventually applies the voltage "VPGM" to every word line group from the first group to a final group including the endpoint unused word line in this manner or every group between the first group and the final group along the string.

2-5. Specific Example

Next, a specific example of the second embodiment is described with reference to FIG. 17. In this example, the driver 114 can apply the voltage "VPGM" simultaneously to only "Z" total word lines WL (where Z is an arbitrary integer, and according to the present example, is set as 8) in the first write operation. According to the second embodiment, the set of word lines to which the voltage "VPGM" can be applied simultaneously is thus determined to be 8 total word lines WL. For example, the programing can be performed on each of a first group (the word lines WL 0 to WL 7), a second group (WL 8 to WL 15), a third group (WL 16 to WL 23), a fourth group (WL 24 to WL 31), a fifth group (WL 32 to WL 39), and a sixth group (WL 40 to WL 47). Here, a case is described where the programming can be performed in batch of eight word lines WL, but no such limitation is necessarily imposed by this example and the number of word lines in the groups is not limited to any particular value. In this specific the first writing is to be performed on the head point unused word line WL 6 to word line WL 47 in groups of eight word lines.

2-5-1. Command Sequence

Figure 17:
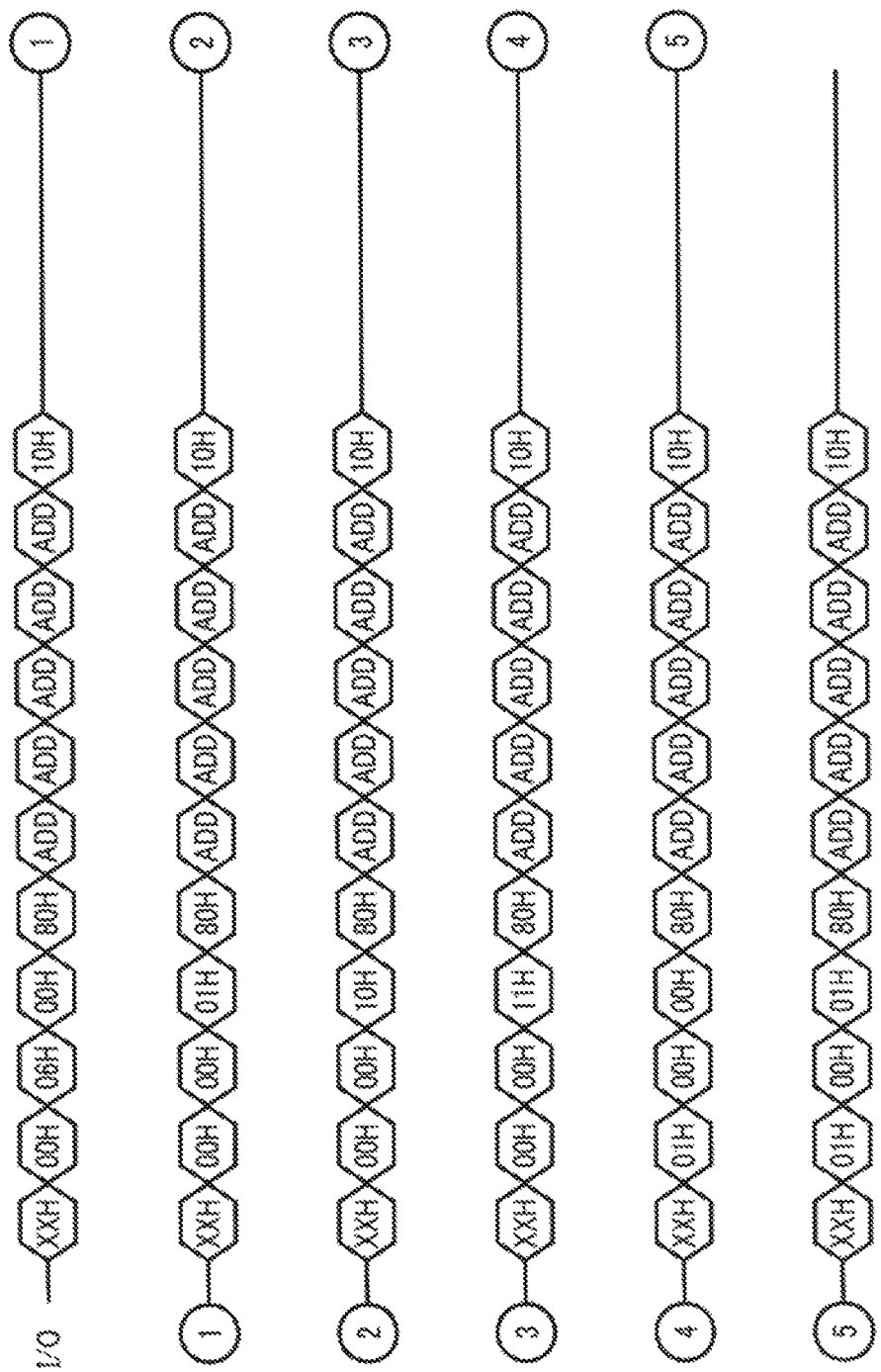
FIG. 17 is a command sequence of the first writing in the semiconductor memory device according to the second embodiment.

A command sequence relating to the first writing according to the second embodiment is described with referring to FIG. 17. At this point, for simplicity in explanation, only the command is illustrated. Other signals take the same form as describe in conjunction with the first embodiment.

When performing the first writing, the memory controller 200 issues the command "XXH" that designates the head point unused word line address. In succession to the command "XXH", the memory controller 200 issues a code "00, 06, 00" (refer to FIG. 13) that indicates the head point unused word line is word line WL 6. Thus, the NAND flash memory 100 can recognizes the word line WL 6 as the head point unused word line by this code. Subsequently, the memory controller 200 issues the writing command "80H". Next, the memory controller 200 issues the writing command "10H". In response to the storing of the command "10H" in the register 113, the sequencer 111 starts the writing operation.

When receiving the command "10H", the NAND flash memory 100 performs the program operation on the first group (specifically, the word lines WL 6 and WL 7 in the first group) in the selected block.

Subsequently, the memory controller 200 performs a determination operation in S2005, which was described with reference to FIG. 16. At this point in time, the word lines WL 8 to WL 47 are also in an unused state ("E" level). For this reason, the memory controller continues the first writing operation.

The memory controller 200 issues the command "XXH" that designates the head not-in-use word line WL address. In succession to the command "XXH", the memory controller 200 issues a code "00, 00, 01" that indicates the head point unused word line is word line WL 8. Thus, the NAND flash memory 100 recognizes the word line WL 8 as the head point word line for this next processing. Subsequently, the memory controller 200 issues the writing command "80H". Next, the memory controller 200 issues an address. Next, the memory controller 200 issues the command "10H".

When receiving the command "10H", the NAND flash memory 100 performs the program operation on the second group (the word lines WL 8 to WL 15).

The memory system 1 thus performs the programing on every eight word lines WL until the programming of all the unused word lines WL is completed.

Figure 18:
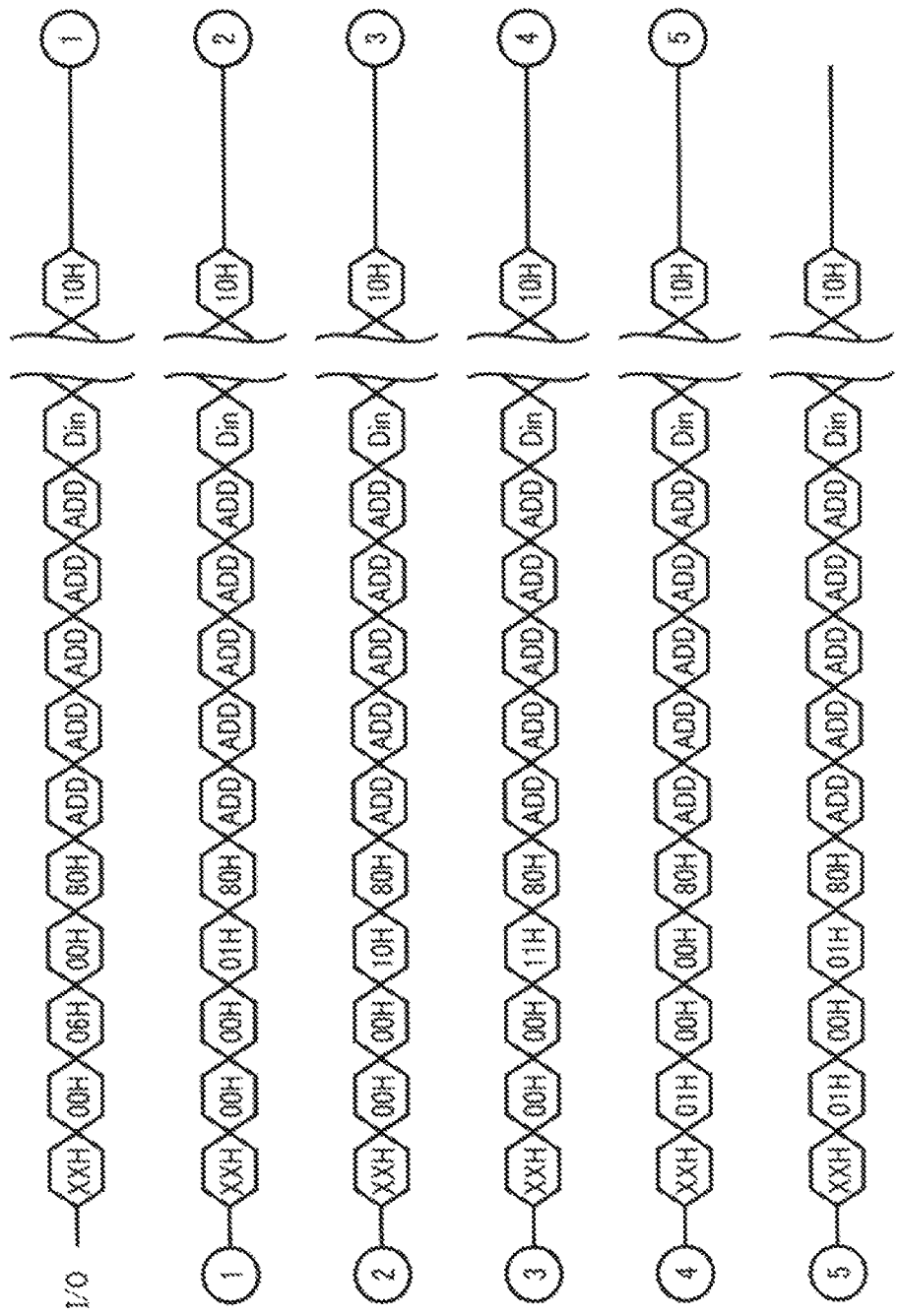
FIG. 18 is another command sequence of the first writing in the semiconductor memory device according to the second embodiment.

In an example that is illustrated in FIG. 17, to-be-written data is not input from the memory controller 200 into the NAND flash memory 100. However, as illustrated in FIG. 18, after the address is input, the memory controller 200 may input to-be-written data Din into the NAND flash memory 100.

According to the second embodiment described above, the head point unused word line is designated with a code such as that illustrated in FIG. 13, but no limitation to this is imposed. For example, as in the first embodiment, the code and the like by which the head point unused word line can be designated with one cycle may be used. Furthermore, a combination of the second embodiment and the modification example 1 of the first embodiment is possible.

Furthermore, according to each of the embodiments described above, (1) for the read operation, a voltage that is applied to the word line which is selected in an A-level read operation, for example, falls within a range of from 0 V to 0.55 V. No limitation to this is imposed, and the voltage may fall within any one of ranges of from 0.1 V to 0.24 V, from 0.21 V to 0.31 V, from 0.31 V to 0.4 V, from 0.4 V to 0.5 V, and from 0.5 V to 0.55 V.

A voltage that is applied to the word line which is selected in a B-level operation, for example, falls within a range of from 1.5 V to 2.3 V. No limitation to this is imposed, and the voltage may fall within any one of ranges of from 1.65 V to 1.8 V, from 1.8 V to 1.95 V, from 1.95 V to 2.1 V, and from 2.1 V to 2.3 V.

A voltage that is applied to the word line which is selected in a C-level read operation, for example, falls within a range of from 3.0 V to 4.0 V. No limitation to this is imposed, and the voltage may fall within any one of ranges of from 3.0 V to 3.2 V, from 3.2 V to 3.4 V, from 3.4 V to 3.5 V, from 3.5 V to 3.6 V, and from 3.6 V to 4.0 V.

Time (tR) for the read operation, for example, may fall within any one of ranges of from 25 μs to 38 μs, from 38 μs to 70 μs, and from 70 μs to 80 μs.

(2) The general writing operation includes the program operation and the verification operation as described above. For such a writing operation, a voltage that is first applied to the word line which is selected when the program operation is performed, for example, falls within a range of from 13.7 V to 14.3 V. No limitation to this is imposed, and for example, the voltage may fall within any one of ranges of from 13.7 V to 14.0 V and from 14.0 V to 14.6 V.

A voltage that is first applied to the selected word line when the writing is performed through an odd-numbered word line and a voltage that is first applied to the selected word line when the writing is performed through an even-numbered word line may be changed.

When the program operation is set to be an incremental step pulses program (ISPP) scheme, for example, approximately 0.5 V is taken as a step-up voltage.

A voltage that is applied to a non-selected word line, for example, may fall within a range of from 6.0 V to 7.3 V. No limitation to this is imposed, and for example, the voltage may fall within a range of from 7.3 V to 8.4 V, and may be equal to or less than 6.0 V.

A pass voltage that is applied may be changed depending on whether the non-selected word line is an odd-numbered word line or an even-numbered word line.

Time (tProg) for the read operation, for example, may fall within any one of ranges of from 1,700 μs to 1,800 μs, from 1,800 μs to 1,900 μs, and from 1,900 μs to 2,000 μs.

(3) For the erasing operation, for example, a voltage that is first applied to a well which is formed on an upper portion of a semiconductor substrate and above which the above-described memory cells are arranged may fall within a range of from 12 V to 13.6 V. No limitation to this is imposed, and for example, the voltage may fall within any one of ranges of from 13.6 V to 14.8 V, from 14.8 V to 19.0 V, from 19.0 to 19.8 V, and from 19.8 V to 21 V.

Time (tErase) for the erasing operation, for example, may fall within any one of ranges of from 3,000 μs to 4,000 μs, from 4,000 μs to , 5000 μs, and from 4,000 μs to 9,000 μs.

(4) A structure of the memory cell has a charge storage layer that is positioned, via a tunnel insulating film with a thickness of from 4 nm to 10 nm, on a semiconductor substrate (silicon substrate). The charge storage layer can have a structure in which an insulating film of SiN, SiON, or the like, which is from 2 nm to 3 nm in thickness, and a film of polysilicon that is from 3 nm to 8 nm in thickness are stacked. Furthermore, a metal such as Ru maybe added to the polysilicon. The charge storage layer has an insulating film thereon. The insulating film, for example, has a silicon oxide film with a thickness of from 4 nm to 10 nm, which is interposed between a lower layer High-k film with a thickness of from 3 nm to 10 nm and an upper layer High-k film with a thickness of from 3 nm to 10 nm. For the High-k film, HfO or the like is used. Furthermore, the thickness of the silicon oxide film can be greater than the thickness of the High-k film. A control electrode with a thickness of from 30 nm to 70 nm is formed, through a material with a thickness of from 3 nm to 10 nm on the insulating film. At this point, such material is a film of metal oxide such as TaO or a film of metal nitride such as TaN. For the control electrode, W or the like is used.

Furthermore, an air gap can be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method of performing dummy data writing on a block of memory cells of a semiconductor memory device, comprising:
   incrementing a count value for the block each time data is read from the block, the count value for the block being reset when all word lines of the block have been used; and
   issuing a command to perform data writing with dummy data when the count value reaches a threshold value.

2. The method according to claim 1, wherein the dummy data to be written pursuant to the command is supplied to the semiconductor memory device.

3. The method according to claim 1, wherein the dummy data to be written pursuant to the command is not supplied to the semiconductor memory device.

4. The method according to claim 1, wherein the command specifies an address where the data writing with the dummy data is to begin.

5. The method according to claim 1, wherein
when the count value reaches the threshold value, multiple commands are issued, each of the commands specifying a different address where the data writing with the dummy data is to begin.

6. A memory system, comprising:
a memory cell array including a block of memory cells, gates of which are connected to a plurality of word lines;
a controller configured to increment a count value for the block each time data is read from the block, the count value for the block being reset when all word lines of the block have been used, and issue a command to perform data writing with dummy data when the count value reaches a threshold value.

7. The semiconductor memory device according to claim 6, wherein the controller specifies the dummy data to be written pursuant to the command.

8. The semiconductor memory device according to claim 6, wherein the controller does not specify the dummy data to be written pursuant to the command.

9. The semiconductor memory device according to claim 6, wherein the command specifies an address where the data writing with the dummy data is to begin.

10. The semiconductor memory device according to claim 6, wherein
when the count value reaches the threshold value, the controller issues multiple commands, each specifying a different address where the data writing with the dummy data is to begin.

* * * * *